United States Patent
Iwasawa et al.

(10) Patent No.: US 10,014,699 B2
(45) Date of Patent: Jul. 3, 2018

(54) BATTERY MONITORING DEVICE

(71) Applicant: HITACHI AUTOMOTIVE SYSTEMS, LTD., Hitachinaka-shi, Ibaraki (JP)

(72) Inventors: Hiroshi Iwasawa, Tokyo (JP); Akihiko Kudo, Hitachinaka (JP); Mitsuo Noda, Hitachinaka (JP); Mutsumi Kikuchi, Hitachinaka (JP); Tomonori Kanai, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 166 days.

(21) Appl. No.: 14/913,842

(22) PCT Filed: Aug. 6, 2014

(86) PCT No.: PCT/JP2014/070662
§ 371 (c)(1),
(2) Date: Feb. 23, 2016

(87) PCT Pub. No.: WO2015/025709
PCT Pub. Date: Feb. 26, 2015

(65) Prior Publication Data
US 2016/0226276 A1    Aug. 4, 2016

(30) Foreign Application Priority Data
Aug. 23, 2013   (JP) .................. 2013-173322

(51) Int. Cl.
*G01N 27/416*   (2006.01)
*H02J 7/00*      (2006.01)
(Continued)

(52) U.S. Cl.
CPC ........ *H02J 7/0029* (2013.01); *G01R 19/2509* (2013.01); *G01R 31/362* (2013.01);
(Continued)

(58) Field of Classification Search
CPC .......... H02J 7/0029; H02J 7/00; H02J 7/0081; G01R 19/2509; G01R 31/362; G01R 31/3658; H01M 10/48; H01M 10/482
See application file for complete search history.

(56) References Cited

U.S. PATENT DOCUMENTS

2011/0260770 A1   10/2011   Sekiguchi
2012/0044010 A1    2/2012   Murakami
(Continued)

FOREIGN PATENT DOCUMENTS

JP   2011-232161 A   11/2011
JP   2012-044768 A    3/2012
(Continued)

OTHER PUBLICATIONS

The Extended European Search Report dated Mar. 20, 2017 in the EP Application No. 14837422.6.

*Primary Examiner* — Daniel Miller
(74) *Attorney, Agent, or Firm* — Volpe and Koenig, P.C.

(57) ABSTRACT

Even with a large ripple voltage superposed on a voltage of a battery cell, the voltage of the battery cell can be measured accurately. In a battery monitoring device, a supply circuit, based on a reference voltage inputted from an assembled battery, generates a driving voltage for driving each of switching elements, of a selection circuit and supplies the driving voltage to the selection circuit. The reference voltage is inputted from the assembled battery to the supply circuit via a detecting filter circuit. As a result, a time constant of a route through which the reference voltage is inputted from the assembled battery to the supply circuit is approximately equal to time constants of detecting filter circuits.

4 Claims, 6 Drawing Sheets

(51) Int. Cl.
*H01M 10/48* (2006.01)
*G01R 31/36* (2006.01)
*G01R 19/25* (2006.01)

(52) U.S. Cl.
CPC ........ *G01R 31/3658* (2013.01); *H01M 10/48* (2013.01); *H01M 10/482* (2013.01); *H02J 7/00* (2013.01); *H02J 7/0081* (2013.01); *H02J 2007/0037* (2013.01)

(56) References Cited

U.S. PATENT DOCUMENTS

| | | | |
|---|---|---|---|
| 2012/0223722 A1 | 9/2012 | Ueda et al. | |
| 2014/0021960 A1* | 1/2014 | Sugimura | G01R 31/362 324/434 |

FOREIGN PATENT DOCUMENTS

| | | | |
|---|---|---|---|
| JP | 2013-053884 A | 3/2013 | |
| JP | 2014-023283 A | 2/2014 | |

* cited by examiner

BATTERY MONITORING DEVICE

TECHNICAL FIELD

The present invention relates to a battery monitoring device.

BACKGROUND ART

Conventionally known is a battery monitoring device which monitors an assembled battery including one or a plurality of battery cells in combination and then performs necessary control. With such a battery monitoring device, upon detection of a voltage of each battery cell and determination of an unsafe state such as excessive charging, taking an action such as current interruption can avoid each battery cell from falling into a dangerous state.

Known as circuit configuration for detecting the voltage of each battery cell in the battery monitoring device described above is, for example, a semiconductor circuit as disclosed in PTL 1 below. This semiconductor circuit includes a cell selection circuit formed of a multiplexer provided with a switch in correspondence with each battery cell, and measures, with an AD converter, the voltage of the battery cell selected by use of this cell selection circuit.

Typically, the multiplexer in the semiconductor circuit is composed of a combination of nMOS switches, that is, switches using an n-channel metal oxide film semiconductor transistor. Upon detection of the voltage of the battery cell selected by use of such a multiplexer, to reduce a detection error, it is preferable to ensure a sufficient voltage between a gate and a source of each nMOS switch to thereby suppress ON resistance at a fixed level or below. To this end, a driving voltage which is approximately several voltages higher than the voltage of the battery cell needs to be supplied to each nMOS switch of the multiplexer. In PTL 1, a supply voltage of the cell selection circuit is supplied from the battery cell, at a top, of the plurality of battery cells via an RC filter.

In a case where a load generating high-frequency current noise like an inverter is connected to the assembled battery, a ripple voltage generated by this current noise is superposed on the voltage of the battery cell whereby a detection error occurs in the voltage of the battery cell. In PTL 1, between the semiconductor circuit and each battery cell, a low-pass filter for removing the ripple voltage is provided.

CITATION LIST

Patent Literature

PTL 1: Japanese Patent Application Laid-Open No. 2012-44768

SUMMARY OF INVENTION

Technical Problem

As is the case with the semiconductor circuit disclosed in PTL 1, in a case where a filter is provided to each of a supply voltage supply line and a battery cell voltage detection line, a relatively large current flows through the filter provided in the supply voltage supply line. Thus, it is preferable that a resistance value of a resistor forming this filter be as small as possible. On the other hand, with the filter provided in the battery cell voltage detection line, to effectively remove the ripple voltage, it is preferable that a time constant of the filter be as large as possible. Therefore, with the conventional battery monitoring device, a time constant typically differs between the filter in the supply voltage supply line and the filter in the battery cell voltage detection line.

As described above, in a case where filters with different time constants are respectively used in the supply voltage supply line and the battery cell voltage detection line, between voltage waveforms outputted from these filters in accordance with a fluctuation in the battery cell voltage, a difference in accordance with the time constants of the filters arises. Thus, superposition of a large ripple voltage on the voltage of the battery cell results in failure to ensure a sufficient potential difference between the supply voltage and the voltage of the battery cell inputted to the multiplexer, resulting in shortage of a gate voltage of each nMOS switch, which may cause a detection error in the voltage of the battery cell. The conventional battery monitoring device has faced such a problem.

In view of the point described above, an object of the present invention is to provide a battery monitoring device which can accurately measure a voltage of a battery cell even with a large ripple voltage superposed on the voltage of the battery cell.

Solution to Problem

A battery monitoring device according to the present invention controls an assembled battery composed of one or a plurality of battery cells, and includes: a selection circuit which as one or a plurality of switching elements respectively connected via voltage detection lines to each battery cell of the assembled battery and which uses the switching element to select, from among the battery cells of the assembled battery, the battery cell targeted for voltage measurement; a supply circuit, based on a reference voltage inputted from the assembled battery, generating a driving voltage for driving each switching element of the selection circuit and supplying the driving voltage to the selection circuit; and a detecting filter circuit being provided on the voltage detection line in correspondence with each battery cell of the assembled battery. In this battery monitoring device, a time constant of a route through which the reference voltage is inputted from the assembled battery to the supply circuit is approximately equal to a time constant of the detecting filter circuit.

Advantageous Effects of Invention

With the battery monitoring device according to the present invention, the voltage of the battery cell can accurately be measured even with a large ripple voltage superposed on the voltage of the battery cell.

DESCRIPTION OF EMBODIMENTS

First Embodiment

Figure 1:
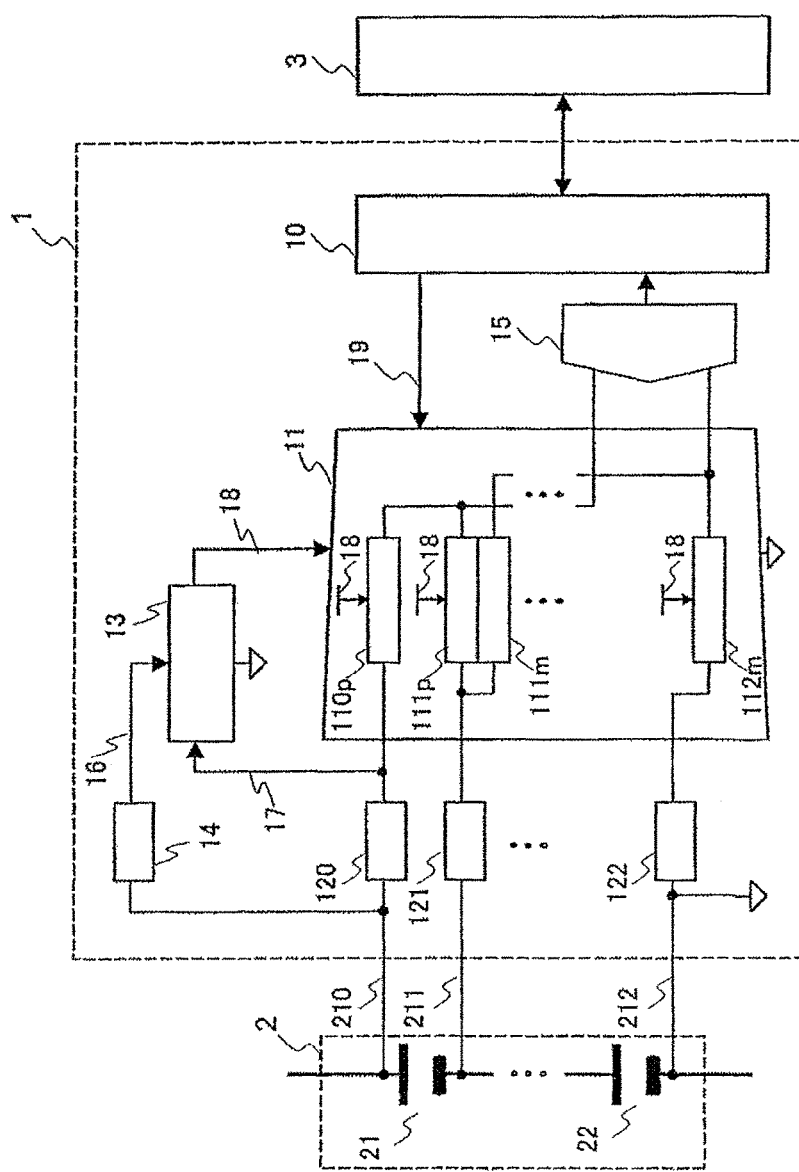
FIG. 1 is a functional block diagram showing configuration of a battery monitoring device according to a first embodiment of the present invention.

Hereinafter, a battery monitoring device according to the first embodiment of the present invention will be described with reference to the drawings. FIG. 1 is a functional block diagram showing configuration of the battery monitoring device 1 according to the first embodiment of the invention. As shown in FIG. 1, the battery monitoring device 1 is connected to an assembled battery 2 and an upper controller 3, and includes therein: a selection circuit 11, detecting filter circuits 120, 121, and 122, a supply circuit 13, a power filter circuit 14, an AD converter 15, and a battery monitoring device controller 10.

The assembled battery 2 is composed of battery cells 21 and 22. Illustrated for a simplified description in FIG. 1 is an example in which the assembled battery 2 is composed of the two battery cells 21 and 22 while other battery cells provided between the battery cell 21 at a top and the battery cell 22 at a bottom are omitted from the illustration. However, the number of battery cells composing the assembled battery 2 is not limited to this. Any plural number of battery cells can be used to compose the assembled battery 2.

The selection circuit 11 is a circuit (multiplexer) for selecting, from among the battery cells 21 and 22 composing the assembled battery 2, the battery cell targeted for voltage measurement, and has switching elements 110$p$, 111$p$, 111$m$, and 112$m$. The switching element 110$p$ is connected to a positive electrode of the battery cell 21 via a voltage detection line 210, the switching elements 111$p$ and 111$m$ are connected to a negative electrode of the battery cell 21 via a voltage detection line 211, and the switching element 112$m$ is connected to a negative electrode of the battery cell 22 via a voltage detection line 212. As described above, the other battery cells provided between the battery cell 21 at the top and the battery cell 22 at the bottom are omitted from the illustration in FIG. 1. Thus, switching elements and voltage detection lines in the selection circuit 11 corresponding to these battery cells (not shown) are also omitted from the illustration in FIG. 1.

The detecting filter circuits 120, 121, and 122 are filter circuits for removing noise from voltage signals respectively inputted by the positive and negative electrodes of the battery cells 21 and 22 via the voltage detection lines 210, 211, and 212. These filter circuits are respectively provided on the voltage detection lines 210, 211, and 212 in correspondence with each of the battery cells 21 and 22 of the assembled battery 2. The detecting filter circuits 120, 121, and 122 are each composed of a resistor and a capacitor, no shown, and respectively have approximately identical time constants. In accordance with the time constants of the detecting filter circuits 120 to 122, a high-frequency noise component contained in the voltage signals inputted from each of the battery cells 21 and 22 of the assembled battery 2 is suppressed.

The supply circuit 13 generates a driving voltage 18 for driving each of the switching elements 110$p$, 111$p$, 111$m$, and 112$m$ of the selection circuit 11 and supplies it to the selection circuit 11. The driving voltage 18 supplied from the supply circuit 13 to the selection circuit 11 is outputted to the switching elements 110$p$, 111$p$, 111$m$, and 112$m$ in the selection circuit 11, and is thereby used in switching operation performed by these switching elements.

To the supply circuit 13, a supply input voltage 16 is inputted from the battery cell 21 of the assembled battery 2 via the voltage detection line 210 and the power filter circuit 14, and also a reference voltage 17 is inputted from the same battery cell 21 via the voltage detection line 210 and the detecting filter circuit 120. The supply circuit 13, based on these inputted voltages, generates, from the supply input voltage 16, the driving voltage 18 obtained through level-shifting of the reference voltage 17 by a fixed voltage, and supplies it to the selection circuit 11.

The power filter circuit 14, as is the case with the detecting filter circuits 120 to 122, is composed of a resistor and a capacitor, not shown. In accordance with a time constant of the power filter circuit 14, an unnecessary noise component contained in the supply input voltage 16 inputted from the battery cell 21 of the assembled battery 2 to the supply circuit 13 is suppressed. Through the power filter circuit 14, a current in accordance with power consumed upon the generation of the driving voltage 18 from the supply input voltage 16 by the supply circuit 13 flows. Thus, a resistance value of the resistor in the power filter circuit 14 is set smaller than resistance values of the resistors in the detecting filter circuits 120 to 122. That is, the time constant of the power filter circuit 14 is not identical to the time constants of the detecting filter circuits 120 to 122.

The AD converter 15 measures a voltage of the battery cell selected by the selection circuit 11, converts it into a digital signal, and outputs it to the battery monitoring device controller 10.

The battery monitoring device controller 10, based on the cell voltage measurement signal outputted from the AD converter 15, performs state control of the assembled battery 2, and also transmits information related to the state of the assembled battery 2 to the upper controller 3 through communication. Moreover, to sequentially select the battery cells 21 and 22 for the voltage measurement, a selection control signal 19 is outputted to the selection circuit 11.

Next, details of the selection circuit 11 will be described. In the selection circuit 11, the switching elements 110$p$, 111$p$, 111$m$, and 112$m$ are each composed of an nMOS switch. The selection circuit 11 can use these switching elements 110$p$, 111$p$, 111$m$, and 112$m$ to select, from the battery cells 21 and 22 composing the assembled battery 2, the battery cell targeted for the voltage measurement. For example, to select the battery cell 21 as the target for the voltage measurement, the switching element 110$p$ corresponding to the positive electrode of the battery cell 21 and the switching element 111$m$ corresponding to the negative electrode of the battery cell 21 are turned ON, and the other switching elements are turned OFF. As a result, a voltage across the battery cell 21 is inputted to the AD converter 15.

In the selection circuit 11, in accordance with the selection control signal 19 inputted from the battery monitoring device controller 10, the driving voltage 18 from the supply circuit 13 is selectively applied as a gate voltage of the switching elements 110*p*, 111*p*, 111*m*, or 112*m*. As a result, each switching element is controlled at either of ON and OFF states.

To turn ON each switching element with sufficiently low ON resistance, a voltage sufficiently higher than the voltage of the battery cell inputted to each switching element needs to be applied to the gate. A voltage difference required at this point varies depending on characteristics of the nMOS switch used. For example, in a case where a voltage difference of 4 V or more is required, to satisfy this, with reference to the reference voltage 17 inputted via the detecting filter circuit 120 at a top, the supply circuit 13 generates the driving voltage 18 obtained through level-shifting therefrom by a voltage of more than 4 V, for example, 5.5 V, and supplies it to the selection circuit 11.

Figure 6:
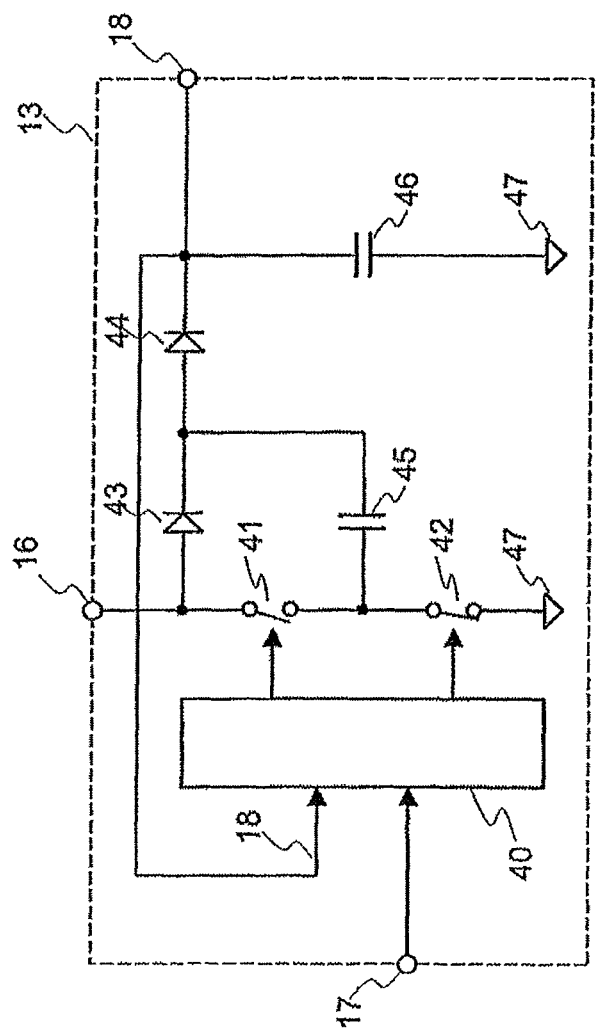
FIG. 6 is a diagram showing configuration of the supply circuit.

Next, details of the supply circuit 13 will be described with reference to FIG. 6. FIG. 6 is a diagram showing configuration of the supply circuit 13. There are a plurality of possible circuit systems realizing the supply circuit 13, but in this embodiment, an example where a charge pump circuit is used will be described below.

The charge pump circuit described below can be composed of a capacitor, diodes, and switches, and thus compared to other supply circuit systems (for example, a boost-type converter) requiring an inductor (coil), has an advantage of a simple, low-cost circuit. On the other hand, it has a disadvantage of a smaller outputtable current compared to the other supply circuit systems. However, such a disadvantage is not a problem since the supply circuit 13 of this embodiment is only required to output a little current required for gate driving of each switching element of the selection circuit 11.

In FIG. 6, the supply circuit 13 is composed of: a supply circuit controller 40, switching elements 41 and 42, diodes 43 and 44, a flying capacitor 45, and an output capacitor 46. The flying capacitor 45 and the output capacitor 46 are each connected to a ground potential 47.

The supply circuit controller 40, based on the inputted reference voltage 17, performs switching control of the switching elements 41 and 42. The switching elements 41 and 42 are switched through the control from the supply circuit controller 40 to thereby perform boost operation using the supply input voltage 16 in corporation with the diodes 43 and 44 and the flying capacitor 45. The boosted voltage is stabilized by the output capacitor 46 and outputted as the driving voltage 18.

The switching elements 41 and 42 are exclusively switched through the control from the supply circuit controller 40. The switching element 41 is formed of a pMOS switch and the switching element 42 is formed of an nMOS switch. In accordance with switching states of the switching elements 41 and 42, a terminal of the flying capacitor 45 on a left in the figure is connected to the supply input voltage 16 or the ground potential 47.

Next, details of the boost operation will be described. In a case where the boost operation is performed by the supply circuit 13, the switching element 41 is first turned OFF and the switching element 42 is turned ON whereby the terminal of the flying capacitor 45 on the left in the figure is connected to the ground potential 47. At this point, with the supply input voltage 16, the flying capacitor 45 is charged through the diode 43.

Next, the switching element 41 is turned ON and the switching element 42 is turned OFF whereby a connection destination of the terminal of the flying capacitor 45 on the left in the figure is switched from the ground potential 47 to the supply input voltage 16. Consequently, a voltage of a terminal of the flying capacitor 45 on a right in the figure is boosted to a voltage obtained by adding a voltage difference between the supply input voltage 16 and the ground potential 47 to the voltage charged in a former stage. Through this boost, the diode 44 is turned ON and the output capacitor 46 is charged whereby the driving voltage 18 is outputted.

As a result of repeating the aforementioned operation by the supply circuit 13, the supply input voltage 16 is boosted and outputted as the driving voltage 18. As a result, where the voltage difference between the supply input voltage 16 and the ground potential 47 is Vs, the supply input voltage 16 can theoretically be boosted to 2Vs at a maximum with respect to the ground potential 47.

However, a too high voltage as the driving voltage 18 may result in excess over pressure resistance of the selection circuit 11. Thus, in the supply circuit 13, with a mechanism of the supply circuit controller 40, the driving voltage 18 is adjusted at a sufficiently enough voltage. That is, the supply circuit controller 40 compares the driving voltage 18 with the reference voltage 17, and performs switching between the switching elements 41 and 42 only when the difference between the driving voltage 18 and the reference voltage 17 is a fixed value, for example, less than 5.5 V. This consequently makes it possible to maintain a state in which the driving voltage 18 is higher than the reference voltage 17 by the fixed voltage (5.5 V).

Adopting the configuration described above permits the supply circuit 13 to output the driving voltage 18 while constantly keeping the state in which the driving voltage 18 is higher by the fixed voltage than the reference voltage 17 inputted via the detecting filter circuit 120, even with a large ripple voltage superposed on the voltage of the battery cell.

Next, effects of outputting the driving voltage 18 by the supply circuit 13 as described above will be described with reference to FIGS. 2 and 3.

Figure 2:
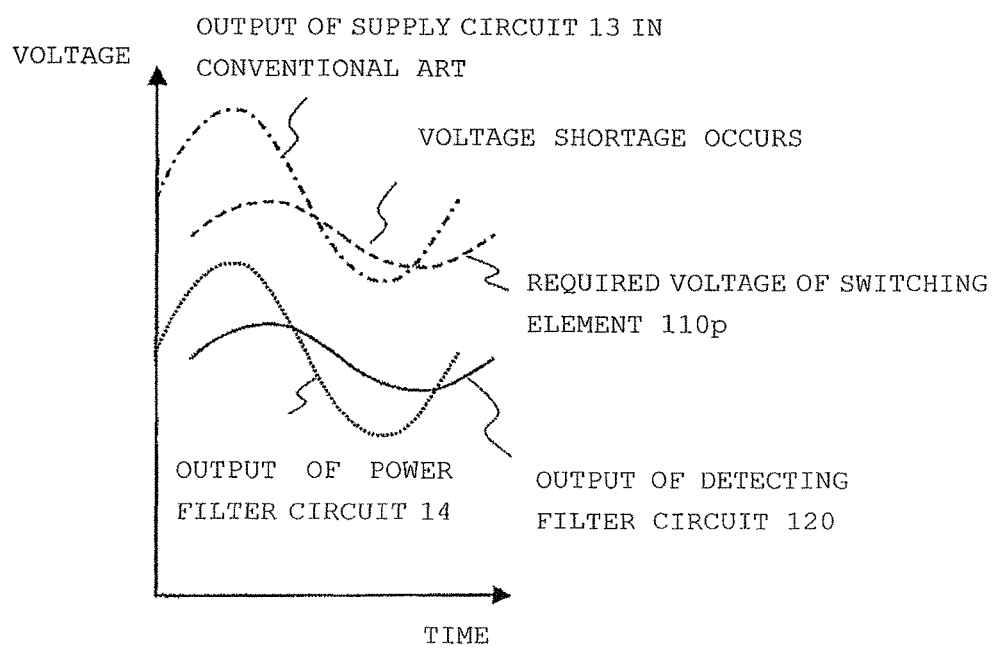
FIG. 2 is a pattern diagram showing relationship between each output waveform from a power filter circuit and a detecting filter circuit and an output waveform of a driving voltage from a supply circuit in a case where a reference voltage is inputted to the supply circuit via the power filter circuit.

FIG. 2 is a pattern diagram showing, as an example of conventional art, relationship between each output waveform from the power filter circuit 14 and the detecting filter circuit 120 and an output waveform of the driving voltage 18 from the supply circuit 13 in a case where the reference voltage 17 is inputted to the supply circuit 13 via the power filter circuit 14.

Superposition of a large ripple voltage on the output voltage from the battery cell 21 via the voltage detection line 210 brings about fluctuation in voltages respectively inputted to the power filter circuit 14 and the detecting filter circuit 120. Here, as described above, the time constant of the power filter circuit 14 and the time constant of the detecting filter circuit 120 are not identical to each other. Thus, as respectively shown by solid lines in FIG. 2, between the output waveform from the power filter circuit 14 and the output waveform from the detecting filter circuit 120, differences in amplitude and phase arise in accordance with the time constant difference.

In a case where the supply circuit 13 has generated the driving voltage 18 with reference to the reference voltage 17 inputted via the power filter circuit 14, in accordance with the output waveform from the power filter circuit 14, the driving voltage 18 outputted from the supply circuit 13 fluctuates as shown by a single-dotted line of FIG. 2. On the other hand, the gate voltage required for driving the switching element 110*p* of the selection circuit 11 fluctuates as shown by a broken line of FIG. 2 in accordance with the output waveform from the detecting filter circuit 120. Thus, depending on an amplitude and a phase of the ripple voltage, the driving voltage 18 falls below the required voltage of the switching element 110*p* as shown in FIG. 2, and gate voltage shortage occurs in the switching element 110p, which may result in failure to correctly measure the voltage of the battery cell 21. The conventional circuit configuration has faced such a problem.

Figure 3:
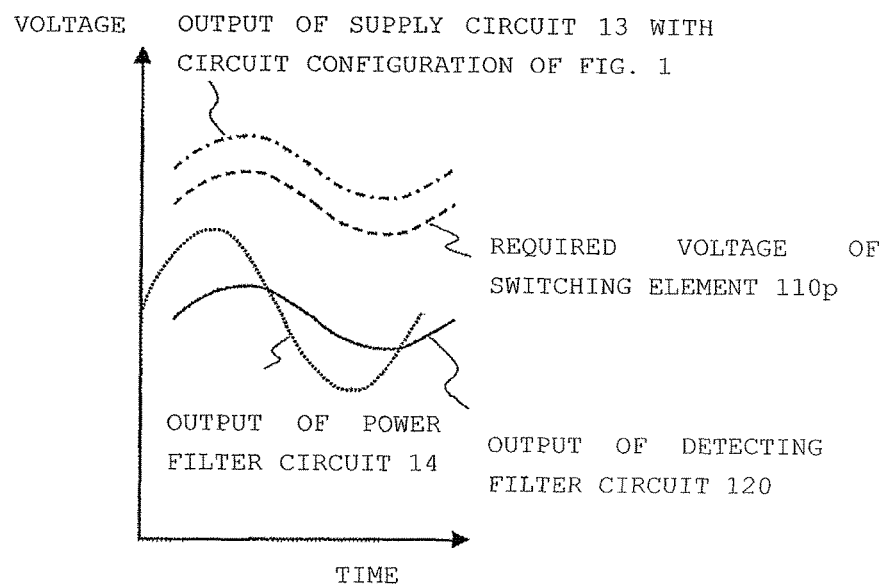
FIG. 3 is a pattern diagram showing relationship between each output waveform from the power filter circuit and the detecting filter circuit and an output waveform of the driving voltage from the supply circuit in circuit configuration of the battery monitoring device according to the first embodiment.

FIG. 3 is a pattern diagram showing relationship between each output waveform from the power filter circuit 14 and the detecting filter circuit 120 and an output waveform of the driving voltage 18 from the supply circuit 13 in the circuit configuration of the battery monitoring device 1 according to the first embodiment shown in FIG. 1.

As in this embodiment, in a case where the supply circuit 13 has generated the driving voltage 18 with reference to the reference voltage 17 inputted via the detecting filter circuit 120, in accordance with the output waveform from the detecting filter circuit 120, the driving voltage 18 outputted from the supply circuit 13 fluctuates as shown by a broken line of FIG. 3. That is, with the circuit configuration of FIG. 1, the driving voltage 18 fluctuates with the same amplitude and the same phase as the gate voltage (broken line in FIG. 3) required for driving the switching element 110p of the selection circuit 11. Thus, a fall of the driving voltage 18 below the required voltage of the switching element 110p as shown in FIG. 2 does not occur, and the voltage of the battery cell 21 can properly be measured at any time.

As described above, in this embodiment, the reference voltage 17 is inputted from the battery cell 21 of the assembled battery 2 to the supply circuit 13 via the detecting filter circuit 120. As a result, a time constant of a route through which the reference voltage 17 is inputted from the assembled battery 2 to the supply circuit 13 and a time constant of a route through which a voltage is inputted from each battery cell of the assembled battery 2 to the selection circuit 11 are made approximately equal to each other. Thus, regardless of a size of the ripple voltage, the voltage of each battery cell can properly be measured.

To accurately measure the voltage of the battery cell 21 in FIG. 1, a sufficient amount of the gate voltage of the switching element 110p needs to be ensured. Thus, a voltage difference between the driving voltage 18 (a one-chain line in FIG. 3) outputted from the supply circuit 13 and the required gate voltage (broken line in FIG. 3) in the switching element 110p needs to be kept at a predetermined value or above in accordance with the configuration of the switching element 110p.

With the circuit configuration of FIG. 1 shown in this embodiment, as the supply circuit 13, a charge pump circuit as described in FIG. 6 is used. As a result, with reference to the reference voltage 17 inputted to the supply circuit 13 via the detecting filter circuit 120, the voltage obtained through level-shifting therefrom by a fixed voltage (for example, 5.5 V) is generated and outputted as the driving voltage 18 to the selection circuit 11. Thus, regardless of output from the power filter circuit 14, a voltage difference as described above can be maintained.

With the circuit configuration of FIG. 1, the reference voltage 17 is inputted from the battery cell 21 of the assembled battery 2 to the supply circuit 13 via the detecting filter circuit 120, but the reference voltage 17 may be inputted from another battery cell to the supply circuit 13 via the detecting filter provided in correspondence with this battery cell. That is, the reference voltage 17 is inputted from the assembled battery 2 to the supply circuit 13 via any of the detecting filter circuits 120 to 122.

According to the first embodiment of the invention described above, the following effects are provided.

(1) The battery monitoring device 1 is provided for controlling the assembled battery 2 composed of the battery cells 21 and 22, and includes the selection circuit 11, the supply circuit 13, and the detecting filter circuits 120 to 122. The selection circuit 11 has the switching elements 110p, 111p, 111m, and 112m respectively connected via the voltage detection lines 210 to 212 to each of the battery cells 21 and 22 of the assembled battery 2, and uses these switching elements to select, from among the battery cells 21 and 22 of the assembled battery 2, the battery cell targeted for the voltage measurement. The supply circuit 13, based on the reference voltage 17 inputted from the assembled battery 2, generates the driving voltage 18 for driving each of the switching elements 110p, 111p, 111m, and 112m of the selection circuit 11 and supplies it to the selection circuit 11. The detecting filter circuits 120 to 122 are respectively provided on the voltage detection lines 210 to 212 in correspondence with each of the battery cells 21 and 22 of the assembled battery 2. In this battery monitoring device 1, the time constant of the route through which the reference voltage 17 is inputted from the assembled battery 2 to the supply circuit 13 is approximately equal to the time constants of the detecting filter circuits 120 to 122. This permits the voltage of the battery cell to be accurately measured in the battery monitoring device 1 even with a large ripple voltage superposed on the voltage of the battery cell outputted from the assembled battery 2.

(2) The reference voltage 17 is inputted from the assembled battery 2 to the supply circuit 13 via any of the detecting filter circuits 120 to 122. This can reliably achieve approximate agreement between the time constant of the route through which the reference voltage 17 is inputted from the assembled battery 2 to the supply circuit 13 and the time constants of the detecting filter circuits 120 to 122.

(3) The supply circuit 13 can be formed by use of a charge pump circuit as shown in FIG. 6. This makes it possible to realize the supply circuit 13 with the simple, low-cost circuit configuration.

Second Embodiment

Next, a battery monitoring device according to the second embodiment of the invention will be described with reference to the drawings. Described in this embodiment is an example in which the same effects are achieved by a method different from that of the first embodiment described above.

Figure 4:
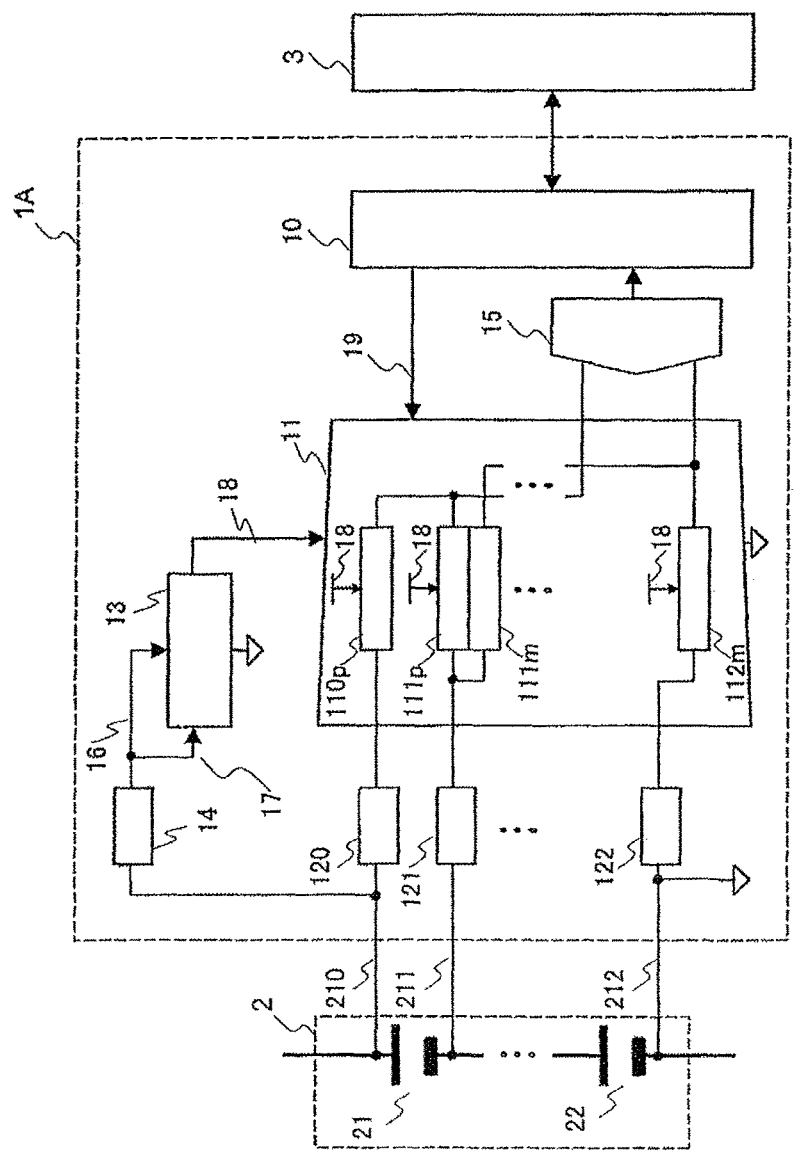
FIG. 4 is a functional block diagram showing configuration of a battery monitoring device according to a second embodiment of the invention.

FIG. 4 is a functional block diagram showing configuration of a battery monitoring device 1A according to the second embodiment of the invention. Differences between the battery monitoring device 1A and the aforementioned battery monitoring device 1 according to the first embodiment lie in that the reference voltage 17 is inputted from the assembled battery 2 to the supply circuit 13 via the power filter circuit 14 and in that the time constant of the power filter circuit 14 approximately agrees with the time constants of the detecting filter circuits 120 to 122. This can realize, with the conventional circuit configuration, the same effects as those described in the first embodiment.

In the battery monitoring device 1A, the power filter circuit 14 is composed of a resistor and a capacitor, not shown. A resistance value of this resistor, for the reason described above, needs to be set smaller than resistance values of the resistors of the detecting filter circuits 120 to 122. Thus, a capacity value of the capacitor in the power filter circuit 14 is set larger than capacity values of the capacitors in the detecting filter circuits 120 to 122 in a manner such as to compensate an insufficient amount of such resistance values. This permits the approximate agreement, in time constant as a product of the resistance value and the capacity value, between the power filter circuit 14 and the detecting filter circuits 120 to 122.

With the configuration described above, as is the case with the first embodiment, even with a large ripple voltage superposed on the voltage of the battery cell, the supply circuit 13 can output the driving voltage 18 while constantly keeping a state in which the driving voltage 18 is higher by a fixed voltage than the reference voltage 17 inputted via the power filter circuit 14.

Figure 5:
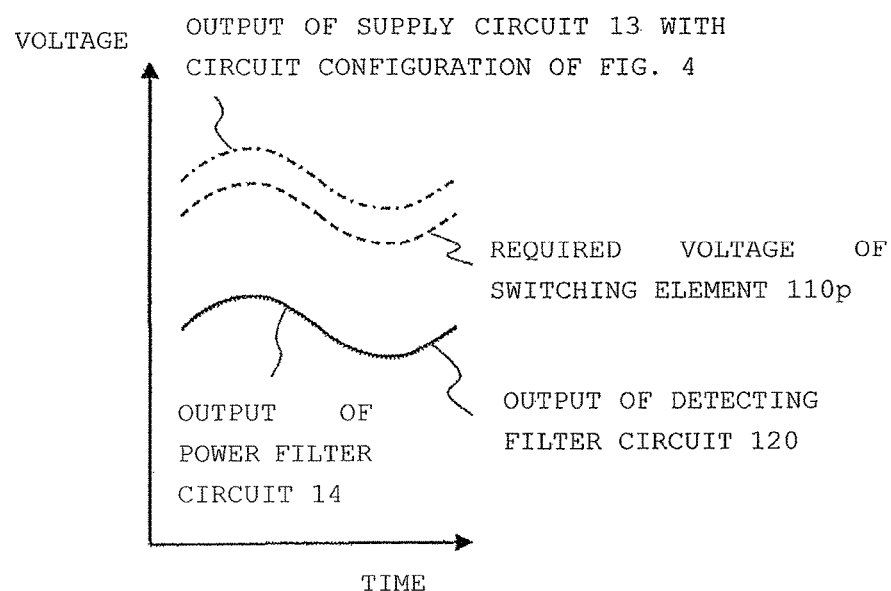
FIG. 5 is a pattern diagram showing relationship between each output waveform from the power filter circuit and the detecting filter circuit and an output waveform of a driving voltage from the supply circuit in circuit configuration of the battery monitoring device according to the second embodiment.

FIG. 5 is a pattern diagram showing relationship between each output waveform from the power filter circuit 14 and the detecting filter circuit 120 and an output waveform of the driving voltage 18 from the supply circuit 13 in the circuit configuration of the battery monitoring device 1A according to the second embodiment shown in FIG. 4.

As in this embodiment, in a case where the time constant of the power filter circuit 14 and the time constant of the detecting filter circuit 120 are in approximate agreement with each other, as each shown by a solid line in FIG. 5, the output waveform from the power filter circuit 14 and the output waveform from the detecting filter circuit 120 are also in approximate agreement. In this case, generation of the driving voltage 18 with reference to the reference voltage 17 inputted via the power filter circuit 14 by the supply circuit 13 causes the driving voltage 18 outputted from the supply circuit 13 to fluctuate, as shown by a broken line of FIG. 5, in accordance with the output waveform from the power filter circuit 14. That is, also in the circuit configuration of FIG. 4, as is the case with the circuit configuration of FIG. 1 described in the first embodiment, the driving voltage 18 fluctuates with the same amplitude and the same phase as the gate voltage (broken line in FIG. 5) required for driving the switching element 110p of the selection circuit 11. Thus, as in FIG. 2 described as the example of the conventional art in the first embodiment, the voltage of the battery cell 21 can properly be measured without a fall of the driving voltage 18 below the required voltage of the switching element 110p.

With the circuit configuration of FIG. 4, the reference voltage 17 is inputted from the battery cell 21 of the assembled battery 2 to the supply circuit 13 via the power filter circuit 14, but the reference voltage 17 may be inputted from the other battery cell to the supply circuit 13 via the power filter circuit 14. That is, the reference voltage 17 is inputted from the assembled battery 2 to the supply circuit 13 via the power filter circuit 14.

According to the second embodiment of the invention described above, the battery monitoring device 1A includes the power filter circuit 14 provided between the assembled battery 2 and the supply circuit 13. In this battery monitoring device 1A, the reference voltage 17 is inputted from the assembled battery 2 to the supply circuit 13 via the power filter circuit 14. Moreover, the time constant of the power filter circuit 14 is approximately equal to the time constants of the detecting filter circuits 120 to 122. This makes it possible to reliably achieve approximate agreement between the time constant of the route through which the reference voltage 17 is inputted from the assembled battery 2 to the supply circuit 13 and the time constants of the detecting filter circuits 120 to 122.

In the first and second embodiments described above, the assembled battery 2 is composed of the two battery cells 21 and 22, but the number of battery cells composing the assembled battery 2 may be larger than this, or may be one. In accordance with the number of battery cells included in the assembled battery 2, increasing or decreasing each of the number of the voltage detection lines and the detecting filter circuits connected between the assembled battery 2 and the selection circuit 11 and the number of switching elements included in the selection circuit 11 makes it possible to apply the invention to assembled batteries 2 with various types of configuration.

The embodiments and modified embodiment described above are each just one example, and unless damaging the characteristics of the invention, the invention is not limited to these contents.

REFERENCE SIGNS LIST

1, 1A battery monitoring device
2 assembled battery
3 upper controller
10 battery monitoring device controller
11 selection circuit
13 supply circuit
14 power filter circuit
15 AD converter
16 supply input voltage
17 reference voltage
18 driving voltage
19 selection control signal
21, 22 battery cells
110p, 111p, 111m, 112m switching elements
120, 121, 122 detecting filter circuits
210, 211, 212 voltage detection lines

The invention claimed is:

1. A battery monitoring device for controlling an assembled battery composed of one or a plurality of battery cells, the battery monitoring device comprising:
    a selection circuit having one or a plurality of switching elements respectively connected via voltage detection lines to each battery cell of the assembled battery, the selection circuit using the switching element to select, from among the battery cells of the assembled battery, the battery cell targeted for voltage measurement;
    a supply circuit, based on a reference voltage inputted from the assembled battery, generating a driving voltage for driving each switching element of the selection circuit and supplying the driving voltage to the selection circuit; and
    a detecting filter circuit being provided on the voltage detection line in correspondence with each battery cell of the assembled battery,
    wherein a time constant of a route through which the reference voltage is inputted from the assembled battery to the supply circuit is approximately equal to a time constant of the detecting filter circuit, and
    wherein the reference voltage is inputted from the assembled battery to the supply circuit via the detecting filter circuit.

2. The battery monitoring device according to claim 1, further comprising
    a power filter circuit being provided between the assembled battery and the supply circuit,
    wherein the reference voltage is inputted from the assembled battery to the supply circuit via the power filter circuit, and
    a time constant of the power filter circuit is approximately equal to the time constant of the detecting filter circuit.

3. The battery monitoring device according to claim 1, wherein the supply circuit is formed by use of a charge pump circuit.

4. A battery monitoring device for controlling an assembled battery composed of one or a plurality of battery cells, the battery monitoring device comprising:

- a selection circuit having one or a plurality of switching elements respectively connected via voltage detection lines to each battery cell of the assembled battery, the selection circuit using the switching element to select, from among the battery cells of the assembled battery, the battery cell targeted for voltage measurement;
- a supply circuit formed by use of a charge pump circuit, based on a reference voltage inputted from the assembled battery, generating a driving voltage for driving each switching element of the selection circuit and supplying the driving voltage to the selection circuit; and
- a detecting filter circuit being provided on the voltage detection line in correspondence with each battery cell of the assembled battery,
- wherein a time constant of a route through which the reference voltage is inputted from the assembled battery to the supply circuit is approximately equal to a time constant of the detecting filter circuit.

* * * * *